United States Patent [19]

Newell et al.

[11] Patent Number: 5,047,734

[45] Date of Patent: Sep. 10, 1991

[54] LINEAR CRYSTAL OSCILLATOR WITH AMPLITUDE CONTROL AND CROSSTALK CANCELLATION

[75] Inventors: Gerald R. Newell, Alamo; Michael W. Nootbaar, Benicia; Pradeep Bhardwaj, Concord, all of Calif.

[73] Assignee: New SD, Inc., San Francisco, Calif.

[21] Appl. No.: 530,640

[22] Filed: May 30, 1990

[51] Int. Cl.$^5$ .................. H03B 1/04; H03B 5/32; H04B 15/00

[52] U.S. Cl. .................................. 331/46; 331/65; 331/105; 331/158; 331/175; 331/183; 455/295

[58] Field of Search .................. 331/46, 65, 105, 109, 331/116 R, 116 FE, 158, 160, 175, 182, 183; 455/295

[56] References Cited

U.S. PATENT DOCUMENTS

| | | | |
|---|---|---|---|
| 3,239,776 | 3/1966 | Shaw | 331/183 X |
| 3,321,715 | 5/1967 | Bloch | 331/183 X |
| 3,731,230 | 5/1973 | Cerny, Jr. | 331/105 X |
| 3,735,266 | 5/1973 | Amitay | 333/2 X |

Primary Examiner—Siegfried H. Grimm
Attorney, Agent, or Firm—Flehr, Hohbach, Test, Albritton & Herbert

[57] ABSTRACT

A series-feedback crystal oscillator has a crystal element in series with a buffer amplifier. The oscillator maintains a linear oscillation signal by using an amplitude control circuit to hold the oscillation signal to a certain level at which distortion, clipping, or saturation does not occur. A control signal indicative of the amplitude of the oscillation signal linearly multiplies the oscillation signal to control the amplitude of the oscillation signal. Shunt capacitance across the crystal is compensated for by connecting a compensating capacitor to the same input terminal of the buffer amplifier as is connected the crystal. A compensating signal, which is equal in amplitude but opposite in phase to the signal passing through the shunt capacitance of the crystal is fed to the input terminal of the buffer amplifier to cancel the effect of the shunt capacitance. A noninverted tracer signal is injected in the feedback loop and passes through the shunt capacitance. An inverted tracer signal passes through the compensating capacitor to cancel the noninverted tracer signal through the shunt capacitance and thereby compensate for the shunt capacitance of the crystal. Interfering crosstalk signals from one crystal oscillator circuit which are coupled into a second crystal oscillator circuit are reduced by feeding an oppositely phased interfering signal into the second crystal oscillator circuit.

16 Claims, 9 Drawing Sheets

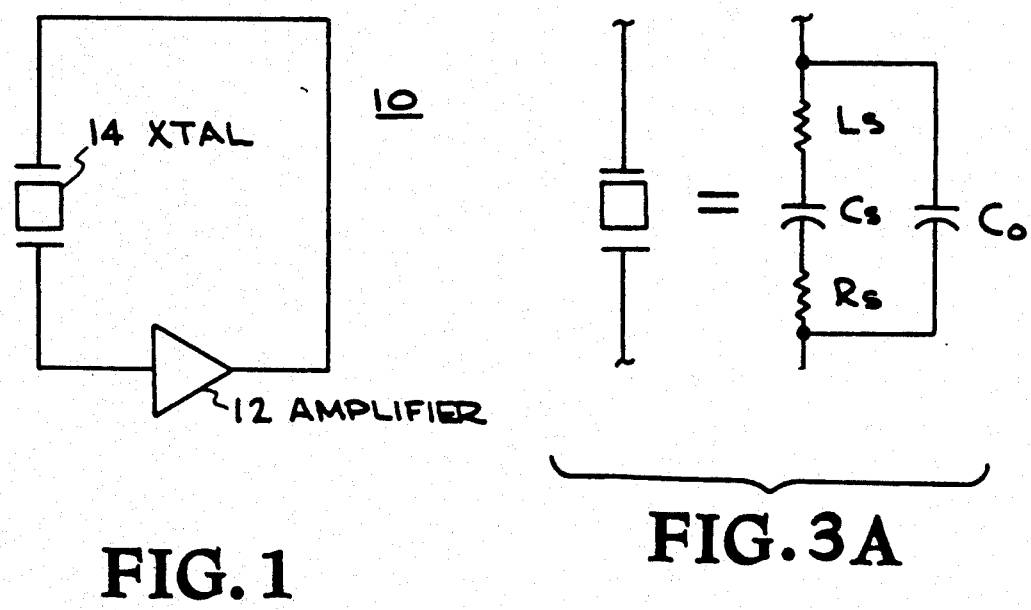
FIG. 1
FIG. 3A
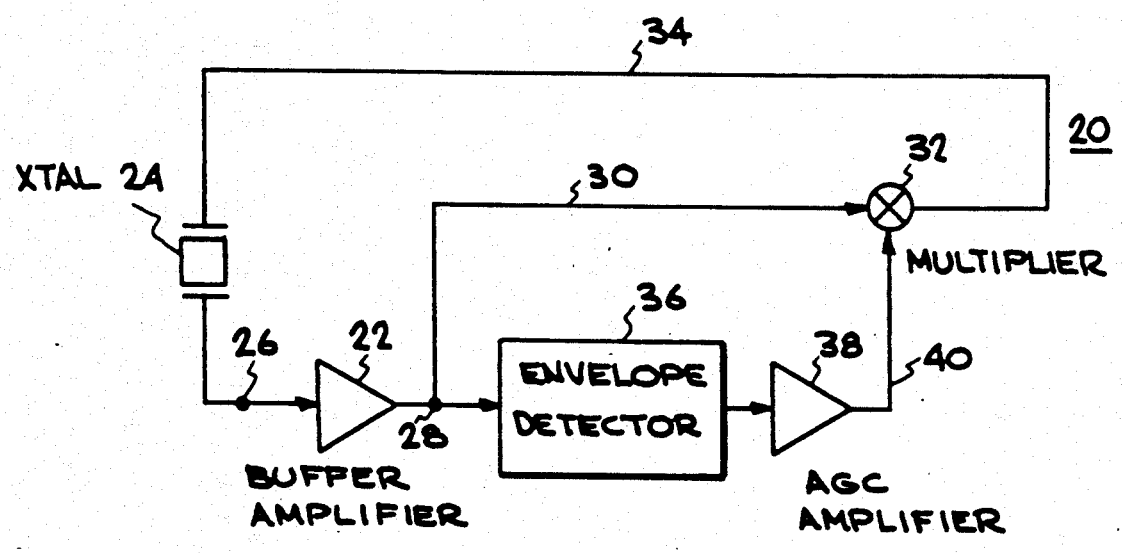
FIG. 2

LINEAR CRYSTAL OSCILLATOR WITH AMPLITUDE CONTROL AND CROSSTALK CANCELLATION

BACKGROUND OF THE INVENTION

1. Field of the Invention

This invention relates to crystal oscillators, and, more particularly, to crystal oscillators providing low distortion sinusoidal output signals.

2. Prior Art

FIG. 1 shows a series feedback crystal oscillator circuit 10 which includes a noninverting amplifier 12 and a crystal 14 in the positive feedback path. The crystal has low impedance at series resonance frequency and high impedance at other frequencies, so the feedback signal is greatest at series resonance. If the amplifier 12 has sufficient gain, the circuit 10 oscillates at a frequency near the crystal resonant frequency. Total loop gain for oscillation, including the effect of the crystal impedance, must be precisely 1. Additional gain causes the amplitude of the oscillation signal to grow until the amplifier begins to clip the signal or to saturate causing the time-averaged gain of the current to drop to 1, at which point the oscillator operation is stable.

Many oscillator circuits are designed to allow the amplifier to clip the oscillation signal at predetermined levels. This design approach produces poor amplitude control for the signals at the crystal input terminal, since the clipping levels or saturation characteristics of a saturating element often vary with time, temperature, power supply levels, and with other environmental factors. A crystal input terminal is a poor place to attempt to obtain amplitude control because the physical amplitude of the oscillation signal is best measured in terms of the output current of the crystal, not its input voltage. The resonant frequency of the crystal is a function of the amplitude of the oscillation signal so it is more important to have control of the amplitude of the crystal output signal instead of the crystal input signal.

Prior art designs for oscillator circuits have produced large harmonic-component signals due to clipping of the oscillation signal. These harmonics may cause interference to other circuits. Harmonic signals pass through the shunt capacitor $C_o$ of the crystal, which can cause problems with the oscillator amplifier and make it difficult to cancel the effect of $C_o$. An additional effect of non-linear operation is that the phase shift though the oscillator circuit cannot be accurately predicted. The phase shift depends on the amount of time that a saturated component takes to recover from saturation. Recovery time can vary greatly depending on environmental conditions. The unpredictability of phase shift is especially important when using low Q crystals which produce significant changes in frequency for small changes in phase shift.

A non-crystal controlled prior art sinewave oscillator used as a waveform generator is disclosed in a 1976 National Semiconductor Company publication entitled "Linear Applications," Volume 1, AN72-19. The frequency selective element is formed by two RC active filter stages. The average value of the sinewave output voltage is detected. The output level is regulated by comparing the average value of the sinewave to a DC reference voltage to provide a sinewave output signal using a differential averaging circuit.

SUMMARY OF THE INVENTION

It is therefore an object of the invention to provide a crystal oscillator which has a controlled, linear oscillation signal to avoid a sensitivity to phase shift changes in the oscillator circuit.

In accordance with this and other objects of the invention, a linear, series-feedback, crystal oscillator is provided which includes a crystal element coupled in series with the input and output terminals of an amplifier. Means are provided for controlling the amplitude of the oscillation signal at a level where the oscillation signal is substantially linear. According to one aspect of the invention, this is accomplished by detecting the amplitude of the oscillation signal at the crystal output to produce a control signal and by multiplying the oscillation signal by the control signal to maintain the oscillation signal at a substantially constant linear level, as measured at the crystal output.

The shunt capacitance across the crystal element is compensated for in a series-feedback crystal oscillator by feeding a compensating signal, which is an inverted version of the signal fed into the crystal element, into the input terminal of the amplifier for the oscillation circuit. An inverted signal is fed through a compensating capacitor to provide the compensating signal, which is substantially equal in magnitude and opposite in phase to the signal passing through the shunt capacitance of the crystal. The compensating signal is intended to reduce the effects of signals passing through the shunt capacitance of the crystal. According to another aspect of the invention, the amplitude of the compensating signal is automatically adjusted by using a tracer signal. The tracer signal is injected into a differential amplifier which produces both a noninverted signal and an inverted signal. The noninverted signal passes through the crystal and the inverted signal passes through the compensation circuit to the input of the amplifier for the oscillator circuit. The inverted and noninverted tracer signals combine and cancel each other to some degree, leaving a resulting residual tracer signal. The amplitude of the residual tracer signal is detected and used to control the amplitude of the inverted tracer signal passing through the compensating capacitor. According to a further aspect of the invention, the compensating capacitor includes a voltage-variable capacitor.

Another aspect of the invention provides for reduction of an interfering crosstalk signal from one crystal oscillator into a second crystal oscillator to prevent the interfering signal from pulling the frequency of the second oscillator. A crosstalk cancellation signal is provided which is opposite in phase to the interfering signal. The oppositely-phased cancellation signal is coupled into the second oscillator circuit to cancel the interfering signal.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a circuit diagram of a prior-art basic series feedback crystal oscillator circuit.

FIG. 2 is a circuit diagram of a series feedback crystal oscillator circuit using an amplitude control circuit for the feedback signal.

FIG. 3A is a diagram of an equivalent circuit for a crystal resonator, including the shunt capacitance $C_o$.

DETAILED DESCRIPTION OF THE PREFERRED EMBODIMENTS

Figure 3B:
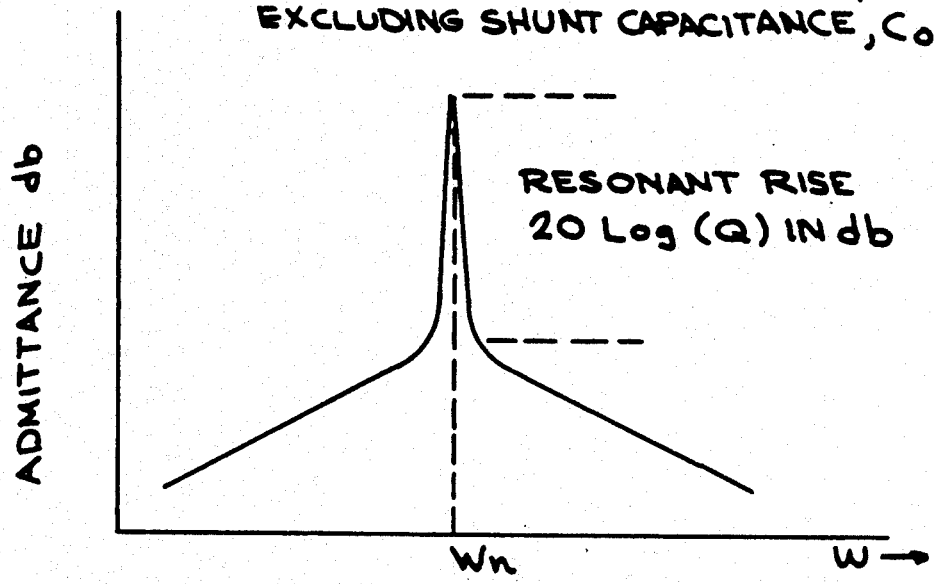
FIG. 3B is a plot of admittance versus angular frequency of a crystal resonator, excluding the effect of the shunt capacitance of the crystal.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Linear Crystal Oscillator

FIG. 2 shows an oscillator circuit 20 which includes a noninverting buffer amplifier 22 with one terminal of a series feedback crystal element 24 connected in series with an input terminal 26 of the buffer amplifier 22. The output terminal 28 of the amplifier 22 is coupled through a signal line 30 to a linear wideband, analog multiplier circuit 32, which functions as a linear, gain-controlled amplifier for the oscillator signal. The output signal from the multiplier circuit 32 is coupled through signal line 34 to the other terminal of the crystal element 24. The looped path comprising the amplifier 22, signal line 30, the linear multiplier 32, signal line 34, and the crystal 24 form a series-feedback oscillator circuit. An oscillation signal passes around the loop. An envelope detector 36 detects the amplitude of the oscillation signal at the output terminal 28 of the amplifier 22. The detected signal is passed through an automatic gain control AGC amplifier 38 which provides signal gain and low-pass filtering to the detected signal to produce a control signal on the signal line 40 connected to the second input terminal of the linear multiplier 32 to maintain the amplitude of the oscillation signal at a constant level.

The oscillator design of FIG. 2 keeps all of the components within their linear operating ranges. It does this by using a wideband analog multiplier 32 in the oscillator feedback to control loop gain. The multiplier 32 allows adjustment of loop gain electrically without allowing the active components to clip or to saturate. The control signal for the multiplier is derived from the amplitude of the buffer amplifier output signal so that when the loop gain is too high, the amplitude of the oscillation signal begins to rise causing the control signal to the multiplier 32 to drop which decreases loop gain to avoid signal clipping or active device saturation.

The advantages of this approach are numerous. Linear analysis techniques may be used to predict circuit performance under various conditions. The crystal output current is amplitude controlled with the amplitude control being as precise as required by setting the AGC loop gain. No undesired harmonics are generated and phase shift is predictable and stable. The ability to use linear analysis allows the use of performance analysis techniques that are not applicable to old designs using nonlinear circuits. Bode plots, root locus and control systems theory can easily and accurately model the operation of this new oscillator design because the precise amplitude control of the crystal output signals ensures that the amplitude of the crystal oscillation current remains constant. This is an important feature because the parameters of a crystal can shift due to a change in the physical amplitude of the oscillation signal. This approach permits performance parameters to be analyzed and adjusted to meet the requirements of a specific application unlike the prior art nonlinear crystal oscillator designs which were difficult to analyze and predict.

Since all circuit components operate in linear modes, the oscillation signal is a sine wave at every node in the loop and no undesired harmonics are generated. This reduces self-generated errors, simplifies cancellation of the crystal shunt capacitance $C_o$, and reduces crosstalk to other nearby electronic circuits.

Phase stability allows accurate and stable oscillations, particularly when using low Q crystals. Low Q crystals are crystals which are damped to have relatively high losses. Typical low Q crystals have Q's less than fifty thousand, while a high Q crystal might have a Q in excess of one million. One particular application of low Q crystal oscillator circuits is in vibratory angular rate sensing systems where information about the angular rate of motion of a craft is inputted to navigation and inertial guidance systems. Resonant sensors employing low Q piezoelectric crystal elements are incorporated in oscillator circuits which change frequency when subjected to acceleration forces. It should be appreciated that extreme accuracy is required for such navigation and guidance systems and that non-linear effects can seriously limit the accuracy of such systems.

Shunt Capacitance Cancellation

FIG. 3A shows the equivalent circuit for a piezoelectric crystal. One leg of the equivalent circuit includes a series inductance $L_s$, a series resistance $R_s$, and a series capacitance $C_s$. In parallel with the series leg is a shunt capacitance $C_o$. The shunt capacitance $C_o$ of the crystal produces a phase error. Ignoring $C_o$ at its resonance frequency, the crystal impedance is equal to the series resistor $R_s$. The capacitive reactance of $C_o$ at resonance combines with $R_s$ to produce a composite capacitive impedance. If the reactance of $C_o$ at resonance is not very much greater than $R_s$, the composite impedance will cause a significant phase shift which will also cause a change in the frequency of the oscillator circuit.

FIG. 3B shows the magnitude of the admittance characteristic for the series leg of the crystal, which includes $L_s$, $C_s$, and $R_s$ but excludes the shunt capacitance $C_o$. The admittance is proportional to the current through the crystal for a given frequency. At the natural resonance angular frequency, the admittance and the crystal current are at a maximum value which is proportional to the Q of the crystal.

Figure 3C:
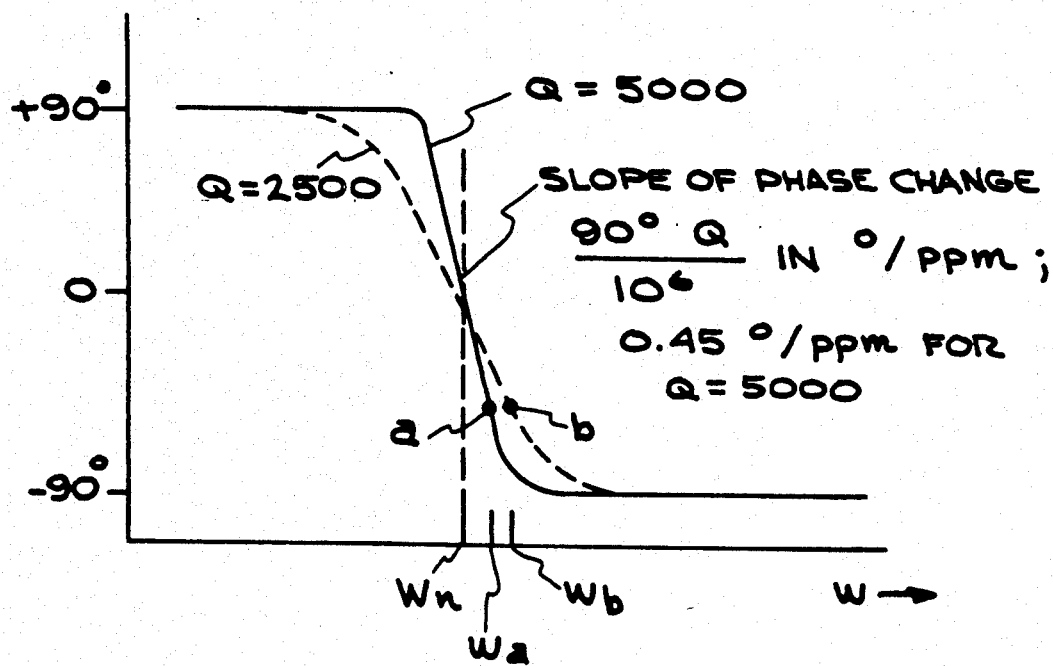
FIG. 3C is a plot of phase versus angular frequency of a crystal resonator excluding the effect of shunt capacitance.

FIG. 3C shows the phase of the admittance characteristic. Below the resonance frequency, the series capacitance of the crystal dominates and the admittance has a phase angle approaching $+90°$. Above the resonance frequency, the series inductance dominates and the admittance has a phase angle approaching $-90°$. At the series resonant frequency, the capacitive and inductive admittances cancel and the phase angle of the admittance is $0°$. In a series feedback oscillator circuit such as shown in FIG. 1, the net phase shift around the circuit must be $0°$. The shunt capacitance $C_o$ of the crystal introduces a phase shift error which the circuit will compensate for by shifting the oscillation frequency away from the natural resonant frequency of the crystal to a frequency at which the series leg of the crystal produces a phase angle opposite to the phase shift caused by the shunt capacitance.

The shape of the phase response is a function of the Q of the crystal. The approximate slope of the phase response curve of FIG. 3C in degrees per part-per-million is given by the following:

$$\frac{90° \, Q}{10^6} \text{ in °/ppm.}$$

For a Q of 5000, the slope is 0.45°/ppm, as represented by the solid curve. For a Q of 2500, the slope is 0.225°/ppm, as represented by the dashed curve.

Low-Q vibrating beam crystal oscillators are used as acceleration-to-electrical frequency transducers. These oscillators provide a 10% change in frequency. As the resonant frequency of the crystal is varied over this frequency range, the crystal and its mounting structure passes through various mechanical resonances due to the characteristics of the crystal and its mounting structure. These resonances draw energy from the vibrating crystal and, in effect, change the Q of the crystal at those resonances. If the crystal is not operating at zero degrees phase shift, such as at point 'a' on the Q=5000 curve, with an oscillation frequency $\omega_a$, a change in Q to the Q=2500 curve changes the crystal operating point to point 'b' with an oscillation frequency $\omega_b$. An oscillator circuit using a crystal can be used to sense a change in frequency to measure a variable such as acceleration, temperature, pressure, etc. Additionally, other types of sensors depend upon precise measurement of amplitude variations. The control signal can be used as a measure of such amplitude variations. Certain precision systems such as accelerometers, temperature sensors, and pressure transducers encode a variable as a frequency shift and require frequency stability in the range of 0.1 to 1 ppm. For a Q of 5000, a 0.1 ppm frequency shift is produced by a 0.005° phase shift. Therefore, it is necessary to avoid any phase shift change which arises from a change in the Q of the crystal at various resonant frequencies. This is accomplished by forcing the crystal to operate at its zero degrees phase shift frequency as described hereinbelow.

Figure 4A:
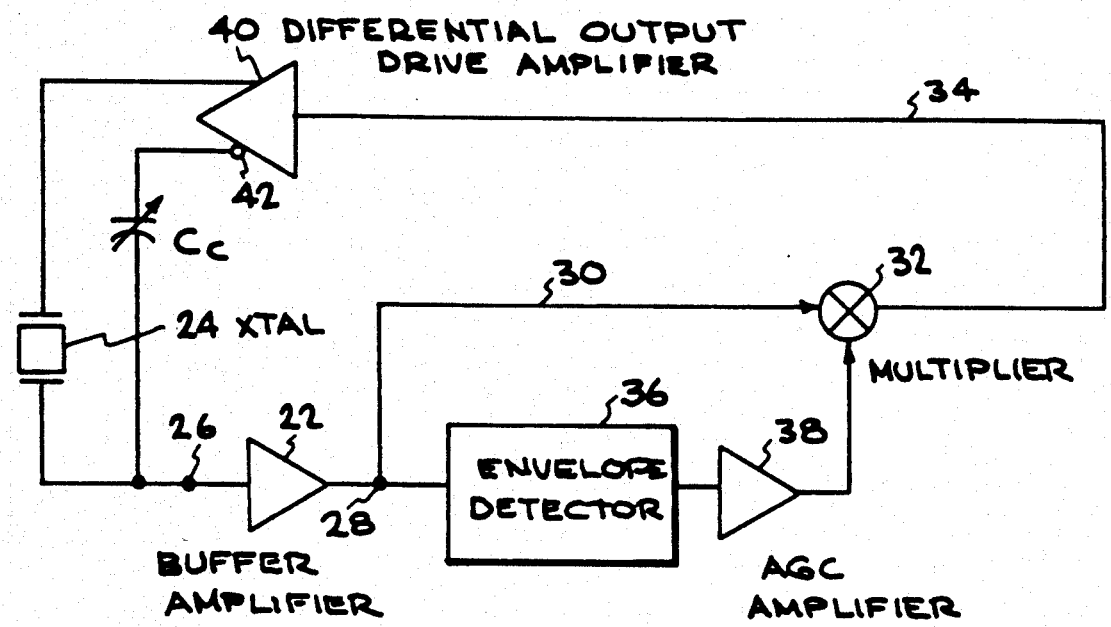
FIG. 4A is a block diagram of an oscillator circuit having a compensating capacitor for cancelling the effect of the shunt capacitance of a crystal resonant element.

FIG. 4A shows a $C_o$ cancellation circuit for the oscillator of FIG. 2. The circuit uses an inverted drive signal from a differential amplifier 40. A differential amplifier is defined as an amplifier which provides a noninverted output signal and an inverted output signal at respective output terminals, each having the same characteristics phase delay, etc. Differential amplifiers are commonly available as video amplifiers having inverted and noninverted output signals. Differential amplifiers are constructed so that the inverted output signal and the noninverted output signals are precisely equal in magnitude and opposite in phase. The inverted drive signal is provided at an output terminal 42 and passes through a cancellation capacitor $C_c$ to inject a current of equal magnitude and opposite sign from the $C_o$ current into the input terminal 26 of the buffer amplifier 22. This effectively cancels the effect of the $C_o$ current. The phase of the inverted signal at terminal 26 must be correct so that the two currents precisely cancel. The magnitude of the inverted signal from the inverted output terminal 42 is not critical since the value of $C_c$ can be adjusted to compensate. The differential output drive amplifier 40 is used to get better phase matching. The effect of using the compensation capacitor $C_c$ is to cancel $C_o$ and operate the crystal at its 0 degree phase angle to avoid the effect of variations in Q.

Figure 4B:
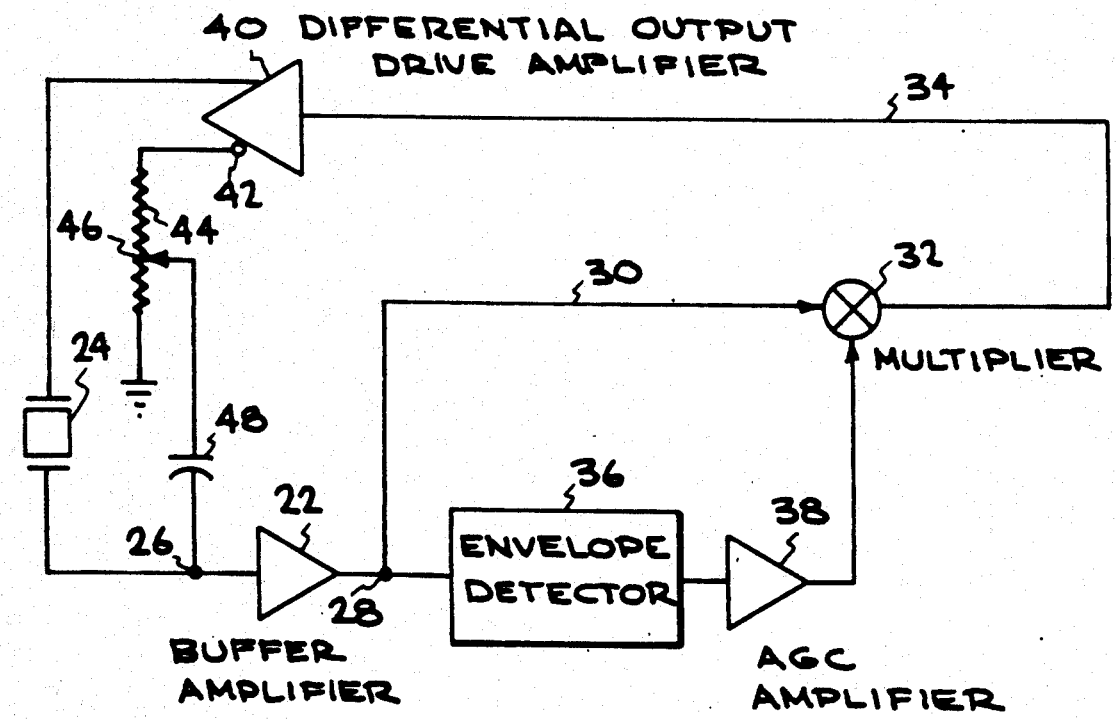
FIG. 4B is a block diagram of an oscillation circuit using a voltage divider circuit in conjunction with a compensating capacitor.

FIG. 4B shows a variable resistive voltage divider 44 connected to a ground reference voltage and to the terminal 42. The tap 46 of the voltage divider is connected to one end of a coupling capacitor 48 and the other end of the coupling capacitor 48 is connected to the input terminal 26 of the buffer amplifier 22.

Figure 4C:
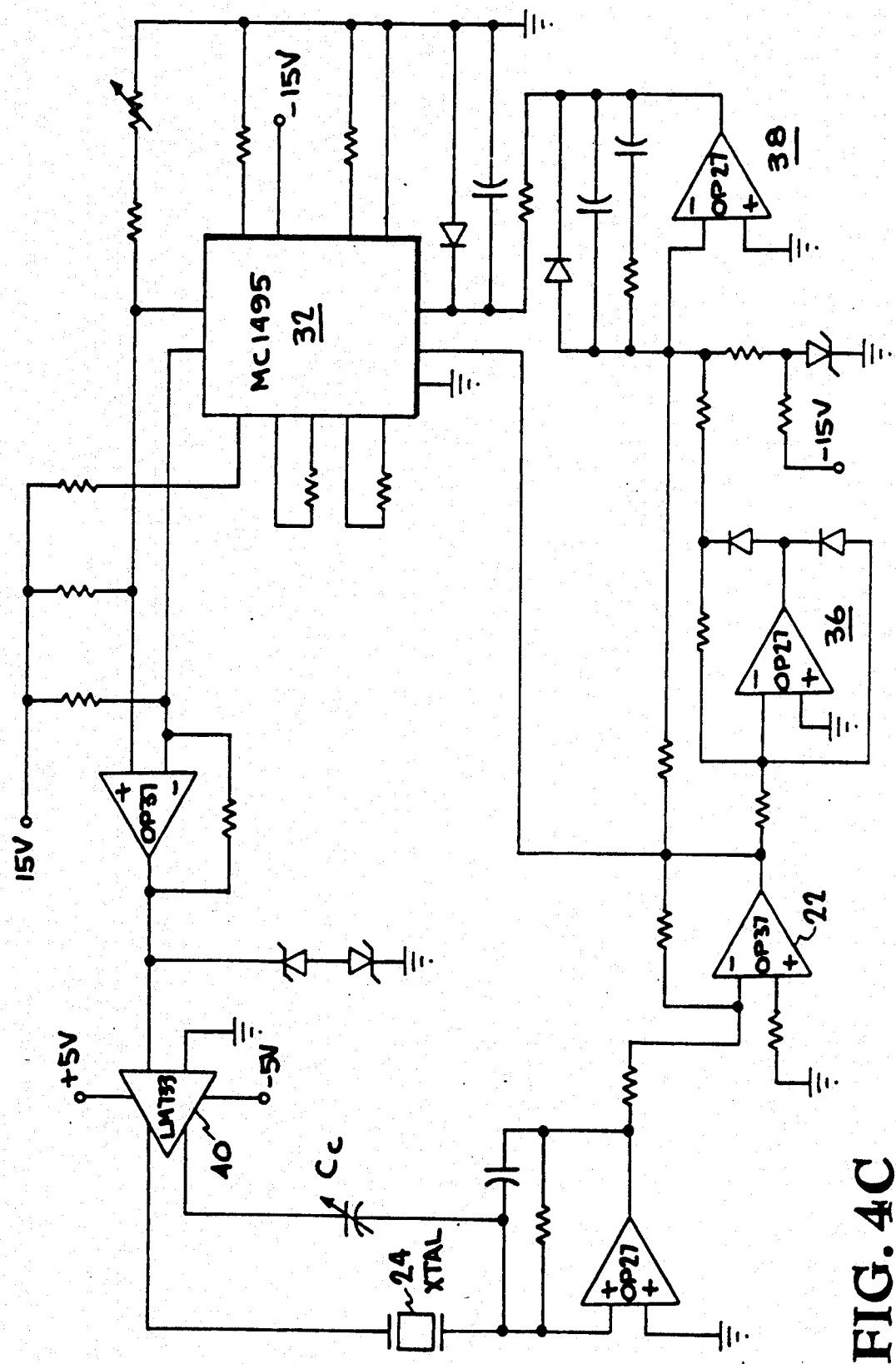
FIG. 4C is a detailed circuit diagram of the oscillator circuit as shown in FIG. 4A.

FIG. 4C shows some of the details of a specific embodiment of the series feedback crystal oscillator shown diagrammatically in FIG. 4A.

Automatic Shunt Capacitance Cancellation

Figure 5:
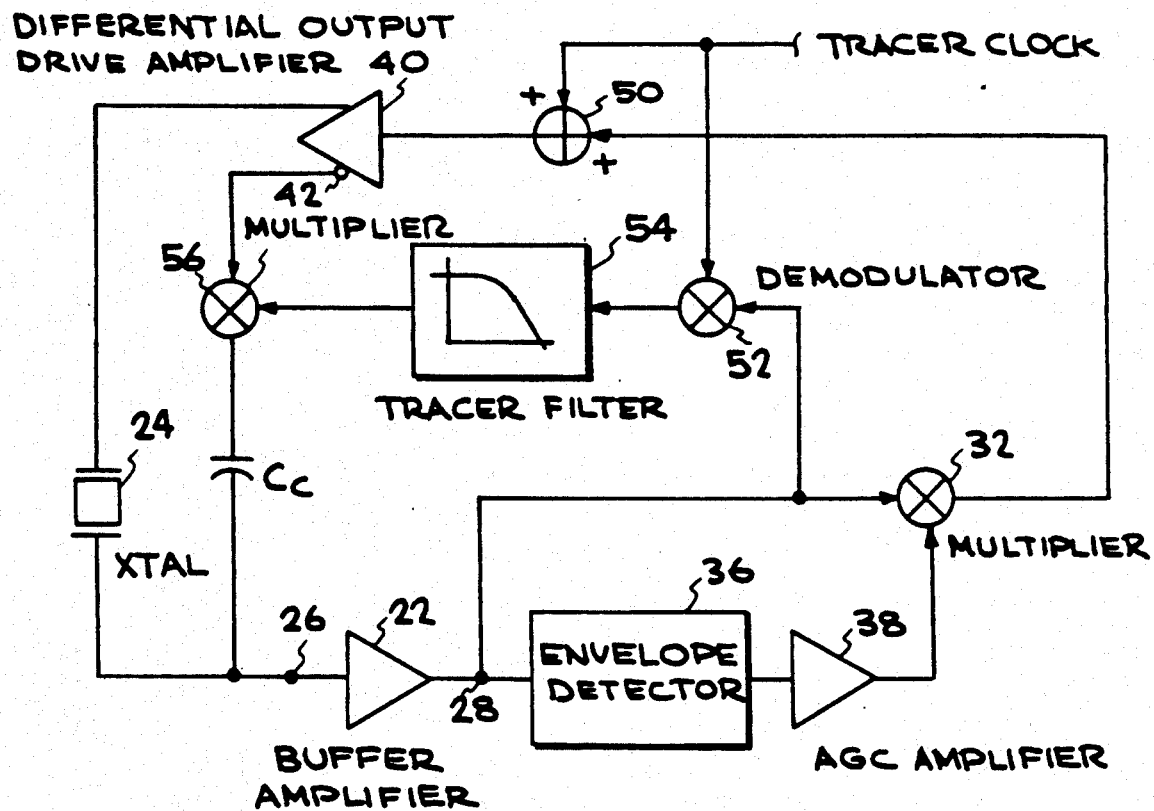
FIG. 5 is a block diagram of an oscillator circuit having a circuit for automatically cancelling the effect of the shunt capacitance of a crystal resonant element.

FIG. 5 shows a system for automatically compensating for the $C_o$ component of the crystal 24. The shunt capacitance cancellation circuit of FIG. 4A allows improved oscillator stability but requires manual adjustment of the cancellation capacitor. The circuit is modified as shown in FIG. 5 to provide a means for electrically trimming the signal through the cancellation capacitor. The circuit shown in FIG. 5 requires a tracer signal which is injected into a summer 50 which is positioned in the signal path just before the differential drive amplifier 40. The tracer signal frequency may be above or below the oscillator frequency, but should not be near any of the crystal overtone resonant frequencies. The tracer signal passes through $C_o$ of the crystal and is cancelled by the signal through $C_c$ when the adjustment is correct. Any deviation from perfect cancellation causes some residual tracer signal to appear at the output of the buffer amplifier 22. This signal is synchronously demodulated in the demodulator circuit 52 using the tracer signal. The resultant signal then is low-pass filtered by an integrator circuit 54 to produce a control signal which is used to readjust the level of the signal through $C_c$ using a linear multiplier circuit 56.

Figure 6:
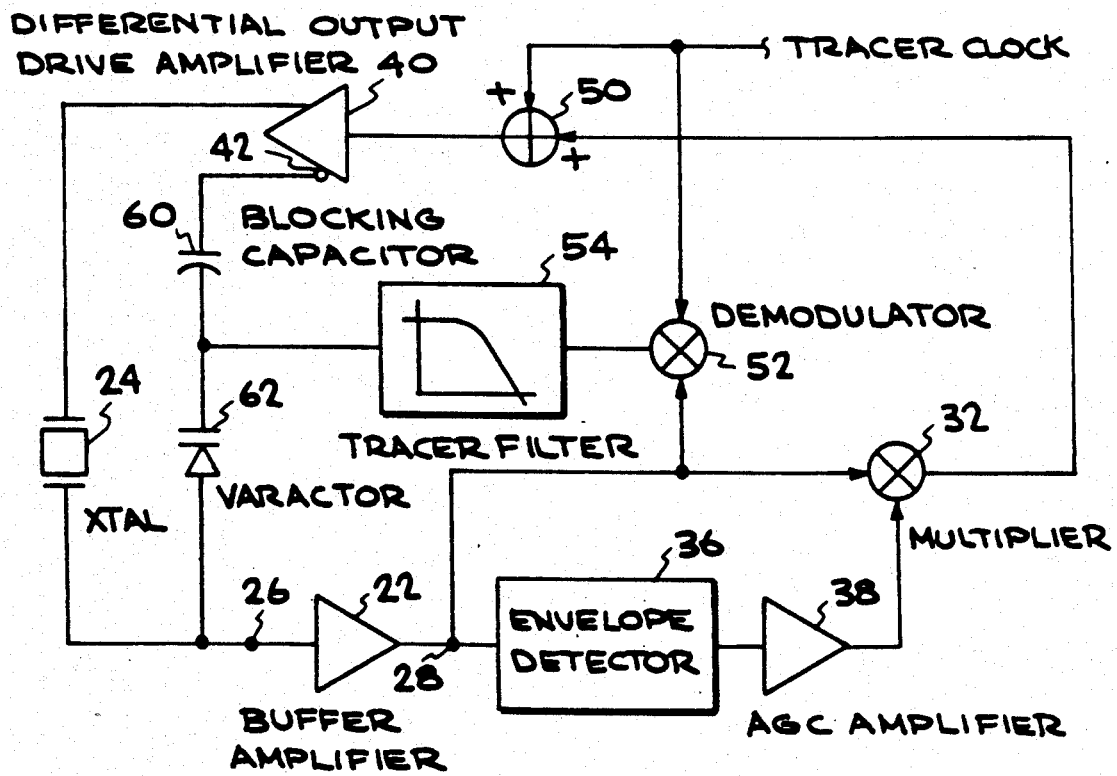
FIG. 6 is a block diagram of an oscillator circuit having a varactor circuit for automatically cancelling the effect of the shunt capacitance of a crystal resonant element.

FIG. 6 shows an alternative method of varying the $C_o$ compensating signal to the input mode 26 of the buffer amplifier 22. The control signal from the low-pass filter 54 is fed to the junction of a series blocking capacitor 60, which is connected to the inverting output terminal 42 of the differential amplifier 40, and a varactor 62. The capacitance value of the varactor 62 is automatically adjusted to null the tracer signal.

Dual Oscillator Crosstalk Cancellation

Some applications require the use of two crystal oscillators operating at very close frequencies. The oscillators may experience crosstalk where the signal of one oscillator feeds through to the other by way of parasitic capacitances. This can cause one oscillator to "pull" on the frequency of the other, that is, cause the second oscillator to operate at an off-resonance frequency. If the frequencies are close enough and the parasitic crosstalk high enough, the oscillators will "lock" and both will operate at the same frequency somewhere between the two resonant frequencies.

Figure 7:
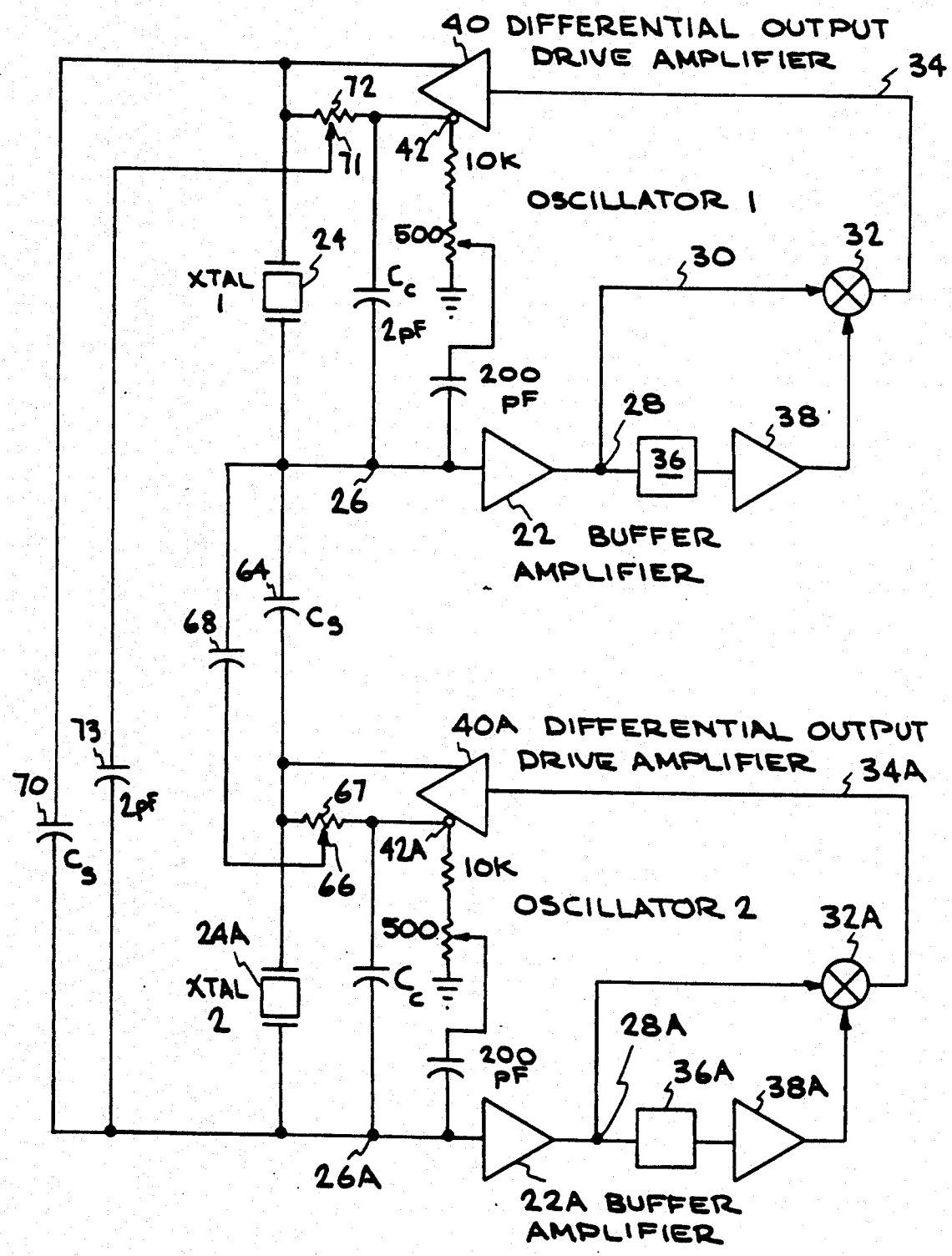
FIG. 7 is a circuit diagram showing a circuit arrangement for compensating for crosstalk between two crystal oscillator circuits.

FIG. 7 shows a crosstalk cancellation circuit which injects a signal into one oscillator from the other oscillator. The injected signal is the inverse of the parasitic crosstalk signal. This cancels to a great extent the parasitic signal and greatly reduces the tendency of the first oscillator to "pull" and incorrectly "lock." The components of the one oscillator are the same as those shown in FIG. 4A while the components of the second oscillator are designated with an A suffix to the reference numerals to indicate similar components.

The parasitic capacitance $C_s$ feeding signals from the second oscillator is represented as a capacitor 64 connected between the noninverting terminal of the differential drive amplifier 40A and terminal 26 which is a virtual ground for the operational amplifier forming the buffer amplifier 22. The effect of this parasitic signal is cancelled by feeding a signal from a tap point 66 on a resistor 67 connected between the inverting and noninverting output terminals of the differential amplifier 40A. The tap point 66 is adjusted to feedback an oppositely-phased signal through a capacitor 68 from the second oscillator circuit to the input terminal of the buffer amplifier 22 of the first oscillator circuit.

Similarly, interference signals coupled to the second oscillator circuit from the first oscillator circuit through a possible capacitor $C_s$ represented as capacitor 70 are cancelled. An oppositely-phased signal from the first oscillator is coupled through a capacitor 73 from a tap 71 on a variable resistor 72, which is connected between the inverting and noninverting terminals of the differential amplifier 40.

Automatic Crosstalk Cancellation

Figure 8:
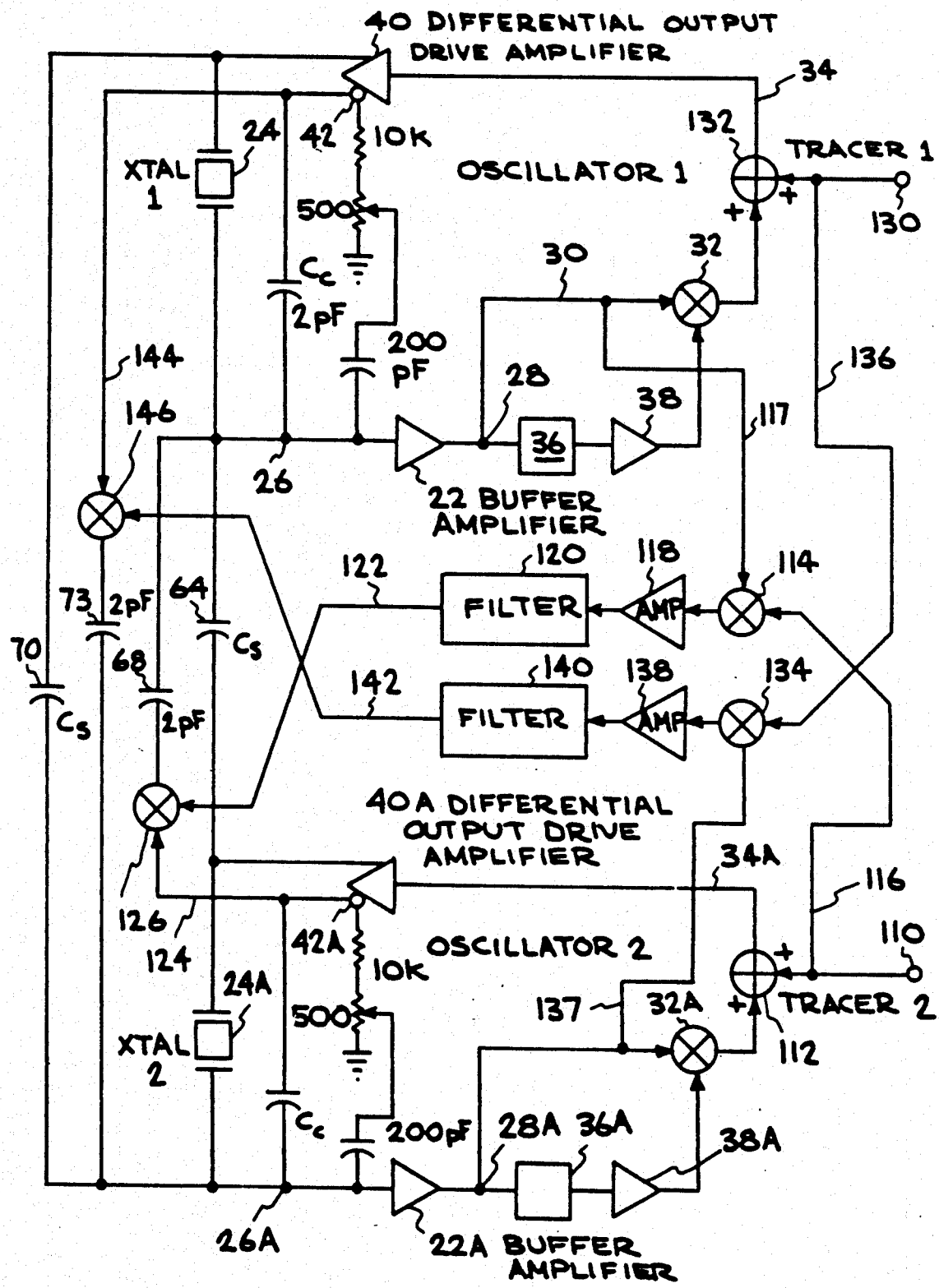
FIG. 8 is a circuit diagram of an automatic crosstalk cancellation circuit.

FIG. 8 shows an automatic crosstalk cancellation circuit which automatically injects a correction signal into one oscillator from the other oscillator. The injected correction signal is the inverse of the parasitic crosstalk signal. The essential components of oscillator 1 and of oscillator 2 are the same as those shown in FIG. 7.

The parasitic capacitance $C_s$, represented by capacitor 4, feeds a signal from the second OSCILLATOR 2 to the virtual ground terminal 26 for the operational amplifier forming the buffer amplifier 22 of the first OSCILLATOR 1. To cancel the effect of the parasitic signal from OSCILLATOR 2 into OSCILLATOR 1, additional circuitry is provided for automatic cancellation using a TRACER 2 signal provided at a terminal 110. The TRACER signal is injected into the series-feedback signal line 34A using a summer circuit 112 as shown in the drawing. The TRACER signal is parasitically coupled from the OSCILLATOR 2 circuit to the OSCILLATOR 1 circuit, so that the amount of TRACER 2 signal found in the OSCILLATOR 1 circuit provides an indication of the amount of oscillator signal itself being parasitically coupled. In order to detect the amount of TRACER 2 signal present in the OSCILLATOR 1 circuit a multiplying detector 114 is provided which has one input terminal coupled to a signal line 116 from the input terminal 110 for the TRACER 2 signal. The other input terminal of the multiplying detector 114 is coupled to a signal line 117 from the signal line 30 of OSCILLATOR 1, as shown in the drawing. The output signal of the multiplying detector 114 is fed through an amplifier circuit 118 and a lowpass filter 120 to provide a control signal on a signal line 122. A correction signal from OSCILLATOR 2, having an opposite phase from the interfering signal is provided from a terminal 42A of OSCILLATOR 2 through a signal line 124 to an input terminal of a linear multiplier 126, which has another input terminal for receiving the control signal on the signal line 122. The correction output signal of the multiplier 126 is passed through the coupling capacitor 68 to the virtual-ground terminal 26 of the OSCILLATOR 1. If the amount of TRACER 2 signal as detected in OSCILLATOR 1 varies, the control signal on signal line 122 varies to provide a proper amount of cancellation signal through the multiplier 126. This circuit therefore functions to automatically cancel the interference from OSCILLATOR 2 parasitically coupled to the circuit of OSCILLATOR 1.

In a similar manner, interference signals from OSCILLATOR 1 are cancelled in OSCILLATOR 2. A TRACER 1 signal is provided on an input terminal 130. Terminal 130 is coupled to one input terminal of a summer 132 which is inserted in series with the feedback signal line 34 of OSCILLATOR 1, as shown. The TRACER 1 signal from terminal 130 is also coupled through a signal line 136 to one input terminal of a multiplying detector 134. The other input terminal of the detector 134 receives a signal on a signal line 137 from the OSCILLATOR 2 as shown. The output signal of the multiplier 134 is amplified by an amplifier 138 and filtered in a lowpass filter 140 to provide a control signal on a signal line 142 for a multiplier circuit 146. The multiplier circuit 146 receives an opposite-phase cancellation signal from OSCILLATOR 1 on a signal line 144. The output signal of the multiplier 146 is fed through a capacitor 73 to the virtual-ground input terminal 26A of OSCILLATOR 2 as shown. The circuitry provides for automatic cancellation of signals parasitically coupled from OSCILLATOR 1 into OSCILLATOR 2.

Figure 9:
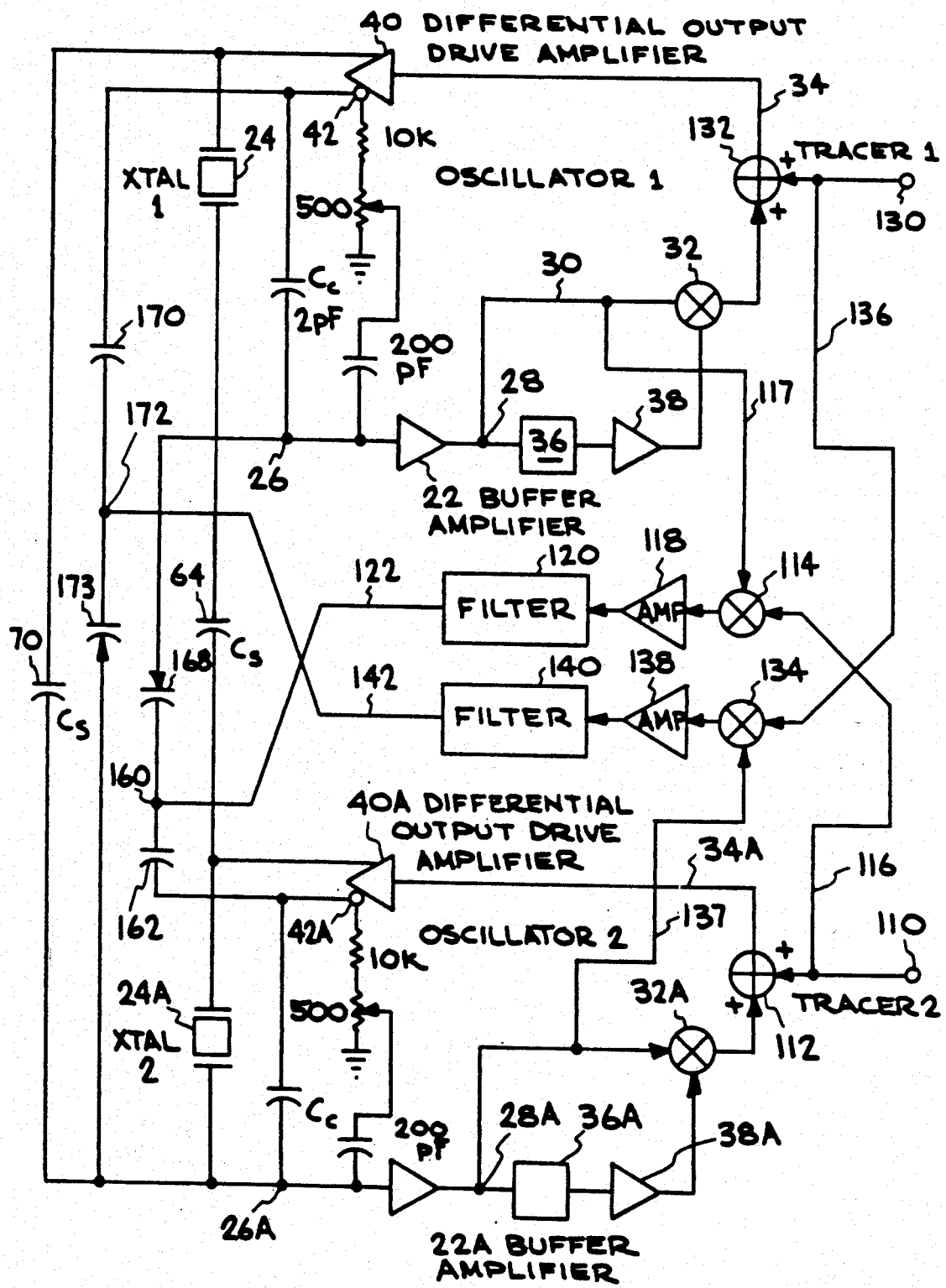
FIG. 9 is a circuit diagram of an automatic crosstalk cancellation circuit using varactors as gain-control elements.

FIG. 9 shows a circuit for automatically cancelling crosstalk using varactors 168, 173 as gain-controlled elements used for automatically controlling the amount of cancellation signal coupled from the source of interference to the OSCILLATOR being interfered with. This circuit is similar to that of FIG. 8 except for the use of varactors as gain-controlling elements for the cancellation signals. The control signal on signal line 122 for controlling the amount of correction signal from OSCILLATOR 2 to OSCILLATOR 1 is connected to a terminal 160. A coupling capacitor 162 couples a correction signal from the inverting output terminal 42A of the drive amplifier 40A of OSCILLATOR 2 to terminal 160. A varactor 168 is connected between the terminal 160 and the virtual-ground input terminal 26 of the OSCILLATOR 1 buffer amplifier 22, as shown. Variation in the level of the control signal on signal line 122 changes the capacitance of the varactor 168 to vary the level of correction signal injected from OSCILLATOR 2 into OSCILLATOR 1. In a similar manner a coupling capacitor 170 provides an automatically adjusted correction signal from OSCILLATOR 1 to a terminal 172. Terminal 172 has a control signal provided on signal line 142. A varactor 173 is connected between the terminal 172 and the virtual-ground input terminal 26A of the buffer amplifier 22A, to provide automatic cancellation of interfering signals.

Figure 10:
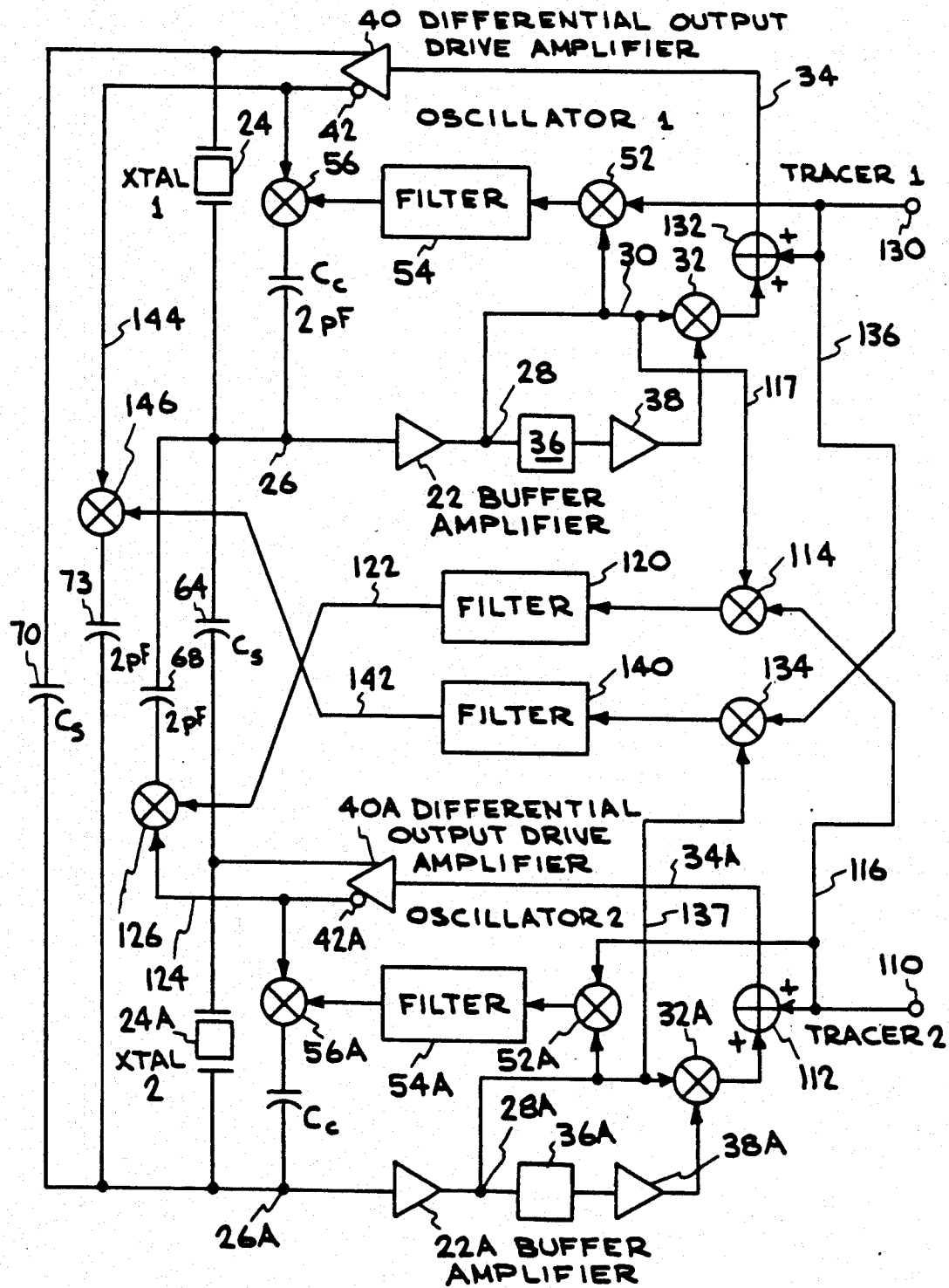
FIG. 10 is a circuit diagram of a circuit for automatically controlling compensation of the shunt capacitance of crystals and for controlling crosstalk cancellation.

FIG. 10 shows circuits for automatically controlling cancellation of the shunt capacitances of the crystals 24,24A and for automatically controlling crosstalk cancellation between OSCILLATOR 1 and OSCILLATOR 2. This circuit combines the functions of FIG. 9 and of FIG. 5, where the functions of FIG. 5 are duplicated in FIG. 10 by elements suffixed with the letter A. As a result, one TRACER signal is used in connection with each of the OSCILLATORS to provide for both shunt capacitance cancellation and for tracing parasitic coupling of an OSCILLATOR into the other OSCILLATOR.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A circuit compensating for the shunt capacitance of a frequency selective crystal element which is in series with a buffer amplifier having input and output terminals in a series-feedback oscillator circuit comprising:

a differential amplifier having an input terminal coupled to the output terminal of said buffer amplifier, said differential amplifier providing a noninverted signal at a noninverting signal output terminal and providing an inverted signal at an inverting signal output terminal;

said crystal element having first and second terminals and having a shunt capacitance between said two terminals, said crystal element having its first terminal coupled to the noninverting output terminal of the differential amplifier and having its second terminal coupled to the input terminal of said buffer amplifier to form said series feedback crystal oscillator circuit;

a compensating capacitor having first and second terminals, said compensating capacitor having its first terminal coupled to the inverting signal output terminal of said differential amplifier and having its second terminal coupled to the input terminals of said buffer amplifier such that the compensating capacitor passes a compensating signal, which is substantially equal in magnitude and opposite in phase to the signal passing through the shunt capacitance of the crystal element, to the input terminal of the buffer amplifier to thereby cancel the effect of the signal passing through the shunt capacitance of the crystal element.

2. The circuit of claim 1 including a variable voltage divider circuit having an input terminal to which the inverting signal output terminal of the differential amplifier is coupled and having a variable output tap terminal to which the compensating capacitor is coupled.

3. The circuit of claim 1 including means for automatically adjusting the amplitude of the compensating signal passing through the compensating capacitor, which automatic adjustment means includes:

means for injecting a tracer signal into said differential amplifier, said tracer signal having a frequency which is different from the series resonant frequency of said crystal element so that said tracer signal passes as a noninverted tracer signal through the shunt capacitance of the crystal element and so that the tracer signal passes as an inverted tracer signal through the compensating capacitor to combine with and cancel the noninverted tracer signal at the input terminal of the buffer amplifier, leaving a residual tracer signal; and means for detecting the amplitude and phase of the residual tracer signal passing through said buffer amplifier with respect to the tracer signal to provide a tracer control signal indicative of the amplitude and phase of the residual tracer signal; and means controlled by said tracer control signal for adjusting the amplitude of the inverted tracer signal passing through said compensating capacitor to minimize said residual tracer signal.

4. The circuit of claim 3 wherein the detecting means includes:

a synchronous demodulator for multiplying the residual tracer signal by the residual tracer signal to produce the control signal; and a lowpass filter for said control signal.

5. The circuit of claim 3 wherein said amplitude adjustment means and said compensating capacitor include a voltage-variable capacitor which is controlled by said tracer control signal.

6. A circuit for reducing an interfering crosstalk signal coupled from a first crystal oscillator circuit to a second crystal oscillator circuit, comprising:

means for providing a crosstalk cancellation signal from the first crystal oscillator circuit, said crosstalk cancellation signal being oppositely phased with respect to the interfering crosstalk signal;

means for coupling said crosstalk cancellation signal into the second crystal oscillator circuit to cancel said interfering signal.

7. The circuit of claim 6 wherein said means for providing a cancellation signal includes means for summing two oppositely-phased signals from said first crystal oscillator to provide a cancellation signal having a selected amplitude and phase.

8. The circuit of claim 7 including a resistor connected between said oppositely-phased signals, said resistor having a variable tap at which is provided the cancellation signal.

9. A system for automatic cancelling of a crosstalk interference signal which is generated in a source circuit and which is coupled through a stray coupling impedance to interfere with a crosstalk-sensitive circuit, comprising:

means for injecting a crosstalk tracer signal into said source circuit, said crosstalk tracer signal having a frequency which does not interfere with operation of said crosstalk-sensitive circuit, crosstalk-cancellation means for coupling an inverted tracer signal from an output terminal of said source circuit to said crosstalk-sensitive circuit, said crosstalk cancellation means including:

an inverter circuit coupled to the output terminal of said source circuit;

amplitude-control means for controlling the amplitude of said inverted tracer signal in response to an inverted-tracer control signal;

means for coupling said inverted tracer signal to an input terminal of said crosstalk-sensitive circuit so that said tracer signal coupled to said crosstalk-sensitive circuit is summed with the oppositely-phased inverted tracer signal to provide a residual tracer signal, which results from imperfect cancellation of said tracer signal and said inverted tracer signal;

means for detecting the amplitude of said residual tracer signal and for generating said inverted-tracer control signal;

wherein said amplitude-control means is controlled by said inverted-tracer control signal to minimize the amplitude of said residual tracer signal so that said crosstalk-cancellation means provides a path for a signal, which is approximately equal in amplitude and opposite in phase to said crosstalk interference signal, to said crosstalk-sensitive circuit to thereby provide for automatic cancellation of said crosstalk interference signal.

10. The system of claim 9 wherein said source circuit is an oscillator circuit providing an oscillation signal which is coupled through said stray coupling impedance to said crosstalk-sensitive circuit.

11. The system of claim 9 wherein said crosstalk-sensitive circuit is an oscillator circuit and wherein said tracer signal has a frequency different than the frequency of oscillation of said oscillator circuit.

12. The system of claim 9 wherein the detection and generation means includes:

a synchronous demodulator for multiplying the residual tracer signal by the tracer signal to produce said inverted-tracer control signal, and a low-pass filter for said inverted-tracer control signal.

13. The system of claim 9 wherein the detection and generation means includes a voltage-variable capacitor which is controlled by said inverted-tracer control signal to control the level of said inverted-tracer signal.

14. In a linear oscillator: an amplifier and a frequency determining element connected in a loop to form an oscillator for producing an output signal of predetermined frequency, means responsive to the output signal for providing a control signal corresponding to the amplitude of the output signal, and means for linearly multiplying the output signal by the control signal to maintain the amplitude of the output signal at a substantially constant level.

15. The oscillator of claim 14 wherein the frequency determining element comprises a series resonant crystal.

16. In a transducer circuit for measuring variations in a physical parameter: an amplifier and a crystal having a series resonant frequency which varies with the parameter to be measured connected in a loop to form an oscillator for producing an output signal having a frequency corresponding to the parameter to be measured, means responsive to the output signal for providing a control signal corresponding to the amplitude of the output signal, and means for linearly multiplying the output signal by the control signal to maintain the amplitude of the output signal at a substantially constant level.

* * * * *